(12) United States Patent
Iwanaga et al.

(10) Patent No.: US 8,107,807 B2
(45) Date of Patent: Jan. 31, 2012

(54) LIGHTING DEVICE, IMAGE PICKUP APPARATUS AND PORTABLE TERMINAL UNIT

(75) Inventors: Hiroki Iwanaga, Yokohama (JP); Akio Amano, Kawasaki (JP); Kenji Shimomura, Kawasaki (JP); Kazuaki Ootsuka, Yokosuka (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 946 days.

(21) Appl. No.: 11/817,264

(22) PCT Filed: Mar. 22, 2007

(86) PCT No.: PCT/JP2007/056745
§ 371 (c)(1),
(2), (4) Date: Aug. 28, 2007

(87) PCT Pub. No.: WO2007/119572
PCT Pub. Date: Oct. 25, 2007

(65) Prior Publication Data
US 2010/0166407 A1    Jul. 1, 2010

(30) Foreign Application Priority Data

Mar. 30, 2006 (JP) ................. 2006-096003

(51) Int. Cl.
*G03B 15/03* (2006.01)
*F21V 9/00* (2006.01)

(52) U.S. Cl. .......... 396/176; 348/371; 362/11; 362/260; 362/230

(58) Field of Classification Search .................. 396/176, 396/155, 164; 348/371; 362/11, 260, 230
See application file for complete search history.

(56) References Cited

U.S. PATENT DOCUMENTS

| 6,344,360 | B1 * | 2/2002 | Colvin et al. ............. 436/94 |
| 2004/0146292 | A1 | 7/2004 | Kawakami | |
| 2005/0030416 | A1 | 2/2005 | Kametani et al. | |
| 2005/0122420 | A1 * | 6/2005 | Matsui ..................... 348/370 |
| 2005/0133686 | A1 | 6/2005 | Ng et al. | |
| 2005/0135079 | A1 | 6/2005 | Yin Chua et al. | |
| 2005/0189557 | A1 | 9/2005 | Mazzochette et al. | |
| 2006/0214578 | A1 | 9/2006 | Iwanaga et al. | |

FOREIGN PATENT DOCUMENTS

| JP | 3-53999 | 5/1991 |
| JP | 5-53999 | 7/1993 |

(Continued)

OTHER PUBLICATIONS

International Search Report for PCT/JP2007/056745 dated Sep. 25, 2007.

(Continued)

*Primary Examiner* — Rochelle-Ann J Blackman
(74) *Attorney, Agent, or Firm* — Turocy & Watson, LLP (57) ABSTRACT

A lighting device including a substrate, and at least three light emitting elements mounted on the substrate, each having an upper light emitting surface in rectangular shape and side light emitting surfaces in rectangular shape. The light emitting elements are positioned to surround a light-gathering region where the light emitting elements are not located, and one of the side light emitting surfaces of each light emitting element is directed to face approximately a central portion of the light-gathering region.

24 Claims, 4 Drawing Sheets

FOREIGN PATENT DOCUMENTS

| | | |
|---|---|---|
| JP | 10-022529 | 1/1998 |
| JP | 2005-055199 | 3/2005 |
| JP | 2005-107074 | 4/2005 |
| JP | 2005-109212 | 4/2005 |
| JP | 2005-158958 | 6/2005 |
| JP | 2005-250394 | 9/2005 |
| JP | 2006-004935 | 1/2006 |
| JP | 2006-032885 | 2/2006 |
| KR | 20030029065 | 4/2003 |

OTHER PUBLICATIONS

Written Opinion on PCT/JP2007/056745 dated Sep. 25, 2007.
Japanese Office Action for Japanese Patent Application No. 2006-096003 mailed on Oct. 26, 2010.
Japanese Office Action for Application No. 2006-096003 mailed on Jul. 12, 2011.

* cited by examiner

LIGHTING DEVICE, IMAGE PICKUP APPARATUS AND PORTABLE TERMINAL UNIT

TECHNICAL FIELD

This invention relates to a lighting device utilizing a light emitting element such as LED, etc., to an image pickup apparatus having the lighting device mounted thereon, and to a portable terminal unit having the image pickup apparatus mounted thereon.

BACKGROUND ART

Although many of recent mobile phones are integrally equipped with a camera, it is difficult with the employment of the camera installed in such a mobile phone to take a clear picture of image especially when a subject exists in a dark place because of the performance of the camera. Namely, although the image pickup performance of the camera depends largely on brightness as well as color rendering of flash illumination to be emitted from a flash mounted on the mobile phone, no one has succeeded as yet to develop such a flash which is capable of exhibiting a sufficient brightness and satisfactory color rendering for enabling a clear picture of image to be taken under such a dark condition.

In recent years, in view of the possibility of reducing the size and weight of a portable terminal unit, much attention has been paid to the employment of an LED flash. The LED flash to be mounted on a portable terminal unit is required, first of all, to be excellent in brightness. Because of this, a plurality of LED chips are generally employed for the purpose of flash illumination at present. However, since the capacity of battery to be employed therein is limited, the efficiency of each LED chip is desired to be as high as possible. Furthermore, since the direction of light toward a subject to be photographed, i.e., the directivity of brightness is a key if the LED chip is to be employed for the purpose of flash illumination, the luminescence intensity (cd) of the LED chip is one of the important characteristics thereof.

Therefore, there have been proposed various ideas such, for example, as; an idea to dispose a reflection plate close to and around an LED chip for the purpose of enhancing the luminescence intensity thereof; an idea to dispose a plurality of LED chips so as to circularly surround one LED chip (see, for example, JP-A 2005-158958); and an idea to dispose a plurality of LED chips with centers thereof being linearly arrayed (see, for example, JP-A 2005-109212 and JP-A 10-22529). In spite of these proposals, no one has succeeded as yet to develop such a flash which is capable of exhibiting satisfactory brightness.

DISCLOSURE OF INVENTION

An object of the present invention is to provide a lighting device which is excellent in brightness and color rendering, an image pickup apparatus wherein this lighting device is employed and which is capable of obtaining a clear image away from a long distance and is suited for taking a portrait, and a portable terminal unit having this image pickup apparatus mounted thereon.

According to a first aspect of the present invention, there is provided a lighting device comprising: a substrate; and at least three light emitting elements mounted on the substrate, each having an upper light emitting surface in rectangular shape and side light emitting surfaces in rectangular shape, wherein the light emitting elements are positioned to surround a light-gathering region where the light emitting elements are not located, and one of the side light emitting surfaces of each light emitting element is directed to face approximately a central portion of the light-gathering region.

According to a second aspect of the present invention, there is provided a lighting device comprising: a substrate; and at least three light emitting elements mounted on the substrate, each having an upper light emitting surface and side light emitting surfaces in rectangular shape, the light emitting elements comprising a first, second, and third light emitting elements, wherein one of the side light emitting surfaces of the first light emitting element is directed to face one of the side light emitting surfaces of the second light emitting element, with a light-gathering region, where the light emitting elements are not located, being interposed therebetween; the third light emitting element is disposed close to the first and second light emitting elements; a first vertical side line forming a boundary between neighboring side light emitting surfaces of the first light emitting element is directed to face one of third vertical side lines forming boundaries between neighboring side light emitting surfaces of the third light emitting element; and a second vertical side line forming a boundary between neighboring side light emitting surfaces of the second light emitting element is directed to face another one of third vertical side lines forming boundaries between neighboring side light emitting surfaces of the third light emitting element.

According to a third aspect of the present invention, there is provided an image pickup apparatus equipped with a flash comprising the aforementioned lighting device.

According to a fourth aspect of the present invention, there is provided a portable terminal unit equipped with the aforementioned image pickup apparatus.

BEST MODE FOR CARRYING OUT THE INVENTION

The lighting device according to a first aspect of the present invention comprises at least three light emitting elements which are disposed on a substrate, each light emitting element having a rectangular upper light emitting surface and side light emitting surfaces. These light emitting elements are arranged so as to surround a light-gathering region where these light emitting elements are not located. One of the side light emitting surfaces of each of these light emitting elements is directed to face approximately a central portion of the light-gathering region.

In this lighting device, a reflector of a cone, pyramid, truncated cone, or truncated pyramid may be present in the light-gathering region. The reflector may have a slant surface which is directed to face one of the side light emitting surfaces of each of the light emitting elements. The reflector may be a pyramid or truncated pyramid.

The lighting device according to a second aspect of the present invention is constructed such that it comprises at least three light emitting elements which are disposed on a substrate and respectively having a rectangular upper light emitting surface and side light emitting surfaces. These light emitting elements may be a first, second, and third light emitting elements. The first and second light emitting elements are disposed such that one of the side light emitting surfaces of the first light emitting element is directed to face one of the side light emitting surfaces of the second light emitting element with a light-gathering region, where these three light emitting elements are not located, being interposed therebetween. A third light emitting element is disposed close to the first and the second light emitting elements such that one vertical side line forming a boundary between neighboring side light emitting surfaces of the third light emitting element is directed to face one of vertical side line forming a boundary between neighboring side light emitting surfaces of the first light emitting element, and another vertical side line forming a boundary between neighboring side light emitting surfaces of the third light emitting element is directed to face one of vertical side line forming a boundary between neighboring side light emitting surfaces of the second light emitting element.

In this lighting device, one vertical side line forming a boundary between neighboring side light emitting surfaces of the first light emitting element and one vertical side line forming a boundary between neighboring side light emitting surfaces of the third light emitting element may exist on a vertical plane including approximately central axes of the first and third light emitting elements; and one vertical side line forming a boundary between neighboring side light emitting surfaces of the second light emitting element and one vertical side line forming a boundary between neighboring side light emitting surfaces of the third light emitting element may exist on a vertical plane including approximately central axes of the second and third light emitting elements.

It should be noted that in the lighting device according to the first and the second aspects of the present invention, a reflection plate may be disposed around and/or beneath the region where the light emitting elements are disposed.

Further, the light emitting element may be enabled to emit near-ultraviolet or blue light.

Furthermore, the lighting devices described above may be employed as a flash.

The image pickup apparatus according to the third aspect of the present invention is equipped with the flash described above.

Furthermore, the portable terminal unit according to the fourth aspect of the present invention is equipped with the image pickup apparatus described above.

Next, various embodiments of the present invention will be explained as follows.

Figure 1:
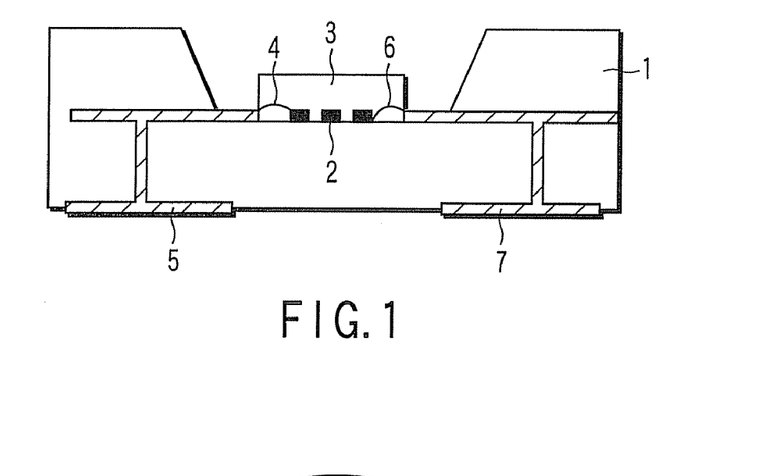
FIG. 1 is a cross-sectional view showing an LED flash according to one embodiment of the present invention.

FIG. 1 shows a general structure of the lighting device according to one embodiment of the present invention wherein a plurality of LED chips mounted thereon as a light emitting source. As shown in FIG. 1, a plurality of LED chips 2 are disposed on the bottom of a recessed portion of a substrate 1, this recessed portion having an open top. These LED chips 2 are covered by a fluorescent layer 3. An upper electrode of each of these LED chips 2 is connected, through a first wire 4, with a first electrode 5. A lower electrode of each of these LED chips 2 is connected, through a second wire 6, with a second electrode 7.

The fluorescent layer 3 is formed of a polymer matrix in which fluorescent particles are dispersed. The LED chips 2 are respectively formed of a GaN-based semiconductor material for instance. Alternatively, in place of the LED chip, the light emitting element may be formed of a laser diode, for example, which is capable of emitting a light of similar wavelength.

The lighting device constructed as shown in FIG. 1 is designed to be operated according to the principle that electrical energy is directly converted into optical energy by means of the LED chips 2, and the light thus created is then converted in wavelength by the effects of a fluorescent substance contained in the fluorescent layer 3, thus enabling a light of different wavelength to emit.

The lighting device according to the first embodiment of the present invention comprises a plurality of LED chips each having a rectangular upper light emitting surface and arranged so as to surround a light-gathering region where these LED chips are not located, and that one of the light-emitting side light emitting surfaces of each of the LED chips is directed to face a central portion of the light-gathering region.

It should be noted that the corner portions of the rectangular upper light emitting surface and of the light-emitting side light emitting surfaces of each of the LED chips may be roundish.

Figure 2A:
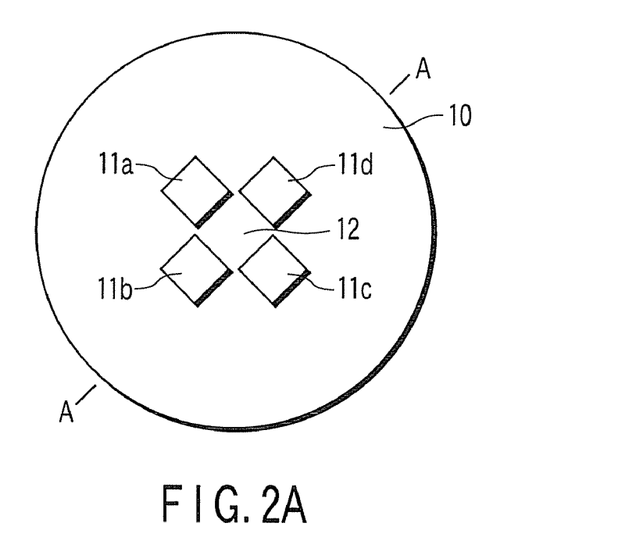
FIG. 2A is a top plan view illustrating an array of LED chips in the LED flash according to a first embodiment of the present invention.
Figure 2B:
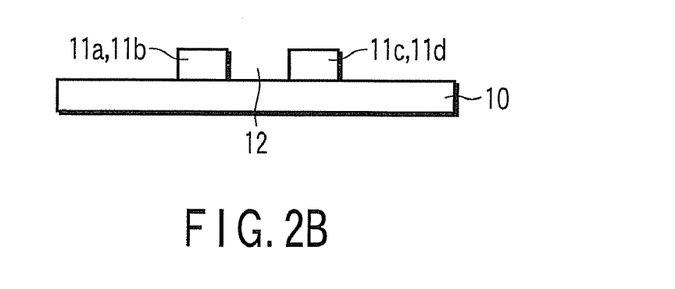
FIG. 2B is a cross-sectional view illustrating an array of LED chips in the LED flash according to the first embodiment of the present invention.

FIGS. 2A and 2B illustrate the arrangement of LED chips in the lighting device according to the first embodiment of the present invention. Specifically, FIG. 2A shows a top plan view thereof, and FIG. 2B shows a cross-sectional view taken along the line A-A of FIG. 2A. As shown in FIGS. 2A and 2B, four LED chips 11a, 11b, 11c and 11d each having a rectangular cross-section are arranged on a substrate 10 so as to surround a light-gathering region 12. In this light-gathering region 12, any LED chip is not disposed. Further, one of the light-emitting side light emitting surfaces of each of the LED chips 11a-11d is directed to face a central portion of the light-gathering region 12.

Figure 3A:
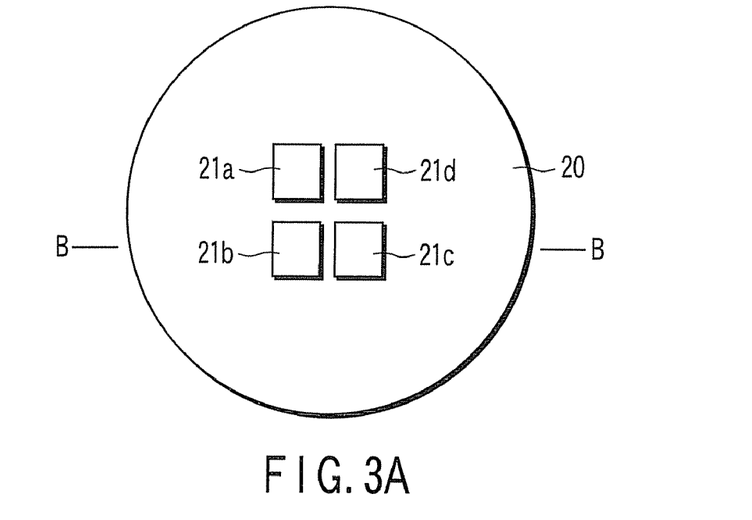
FIG. 3A is a top plan view illustrating an array of LED chips in a conventional LED flash.
Figure 3B:
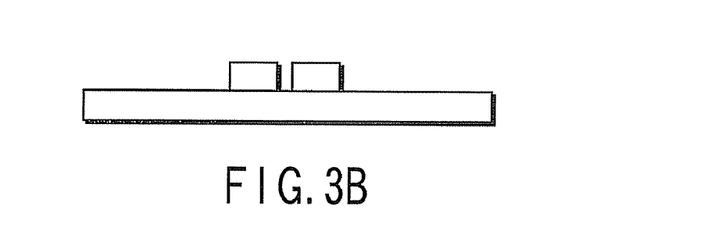
FIG. 3B is a cross-sectional view illustrating an array of LED chips in a conventional LED flash.

FIGS. 3A and 3B illustrate the arrangement of LED chips in a conventional lighting device. FIG. 3A shows a top plan view thereof, and FIG. 3B shows a cross-sectional view taken along the line B-B of FIG. 3A. In the case of the arrangement of LED chips shown in FIGS. 3A and 3B, four LED chips 21a, 21b, 21c and 21d each having a rectangular cross-section are arranged on a substrate 20 so as to form two lines with a narrow space being interposed therebetween. There is no light-gathering region between LED chips 21. Further, one of the light-emitting side light emitting surfaces of each of the LED chips 21a-21d is directed to face one of the light-emitting side light emitting surfaces of a neighboring one of the LED chips 21a-21d.

Generally, the LED chip is configured to have a rectangular cross-section, i.e., formed of a hexahedron. The light is enabled to be emitted not only from the upper light emitting surface of the LED chip but also from the side light emitting surfaces thereof. Therefore, in order to enhance the efficiency of extracting light from the LED chip, how to utilize the emission from the side light emitting surfaces of the LED chip is important.

In the case of the arrangement of the LED chips shown in FIGS. 3A and 3B, strong emission from the side light emitting surfaces of the LED chips 21a-21d is scattered or absorbed as it is obstructed by the neighboring one of the LED chips 21a-21d, thus reducing the efficiency of extracting light from the lighting device.

Whereas, in the case of the lighting device according to the first embodiment of the present invention as shown in FIGS. 2A and 2B, since the light-emitting side light emitting surface of each of the LED chips 11a-11d which is directed toward the light-gathering region 12 is not directed to closely face the side light emitting surface of another of the LED chips 11a-11d, the emission of light from the side light emitting surface is not intercepted from each other, thus making it possible to efficiently extract the emission from the side light emitting surfaces of the LED chips.

The present inventors have conducted experiments wherein four blue light-emitting LED chips were arranged as shown in FIGS. 2A and 2B and sealed with a silicone resin containing no fluorescent substance. Under this condition, an electric current of 20 mA was passed through these LED chips to enable them to emit blue light, the luminous intensity of which was then measured. Likewise, four blue light-emitting LED chips were arranged as shown in FIG. 3 and sealed with a silicone resin containing no fluorescent substance. Under this condition, an electric current of 20 mA was passed through these LED chips to enable them to emit blue light, the luminous intensity of which was then measured. The results obtained from this experiment are shown in FIG. 4.

Figure 4:
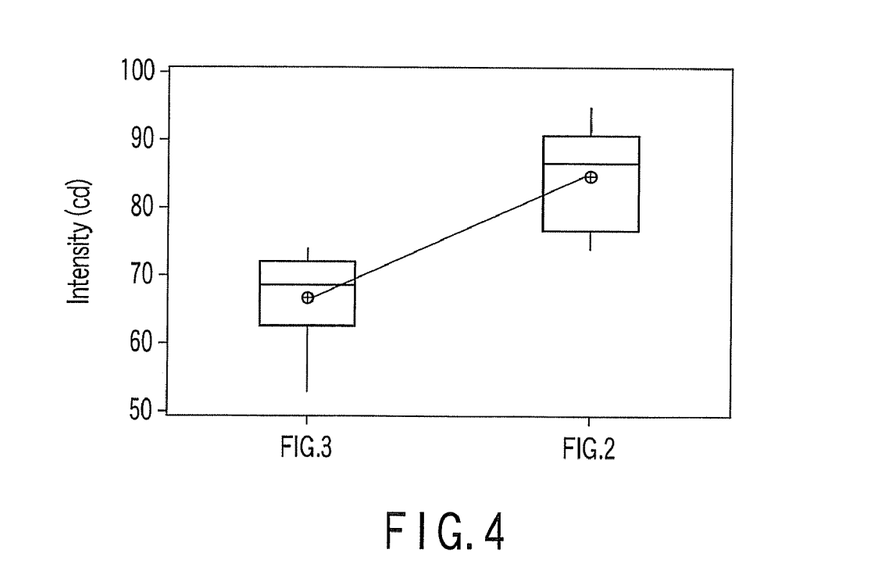
FIG. 4 is a diagram illustrating the comparison in emission intensity between the LED flash according to the first embodiment of the present invention and a conventional LED flash.

It will be recognized from FIG. 4 that when four blue light-emitting LED chips were arranged as shown in FIGS. 2A and 2B, it was possible to greatly increase the luminous intensity of emission as compared with the case wherein these LED chips were arranged as shown in FIGS. 3A and 3B.

Figure 5:
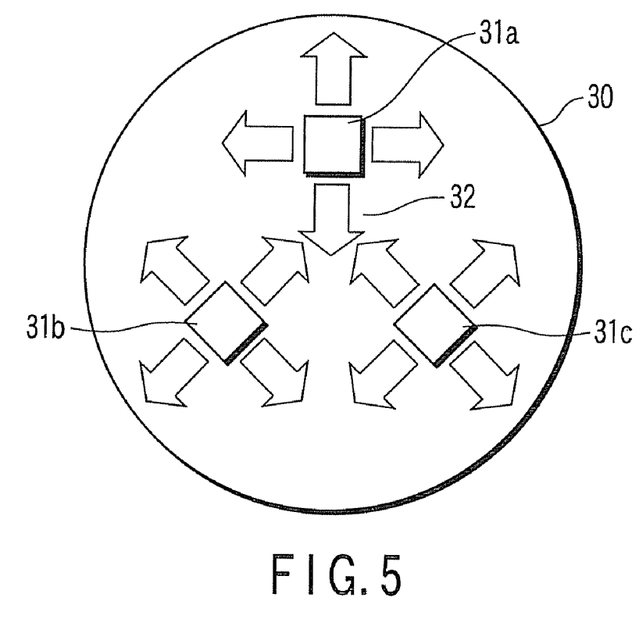
FIG. 5 is a top plan view illustrating an array of LED chips in the LED flash according to a second embodiment of the present invention.

FIG. 5 illustrates the arrangement of LED chips according to a second embodiment of the present invention. In the case of the arrangement of LED chips shown in FIG. 5, three LED chips 31a, 31b and 31c, each having a rectangular cross-section, are mounted on a substrate 30 and arranged so as to surround a light-gathering region 32. In this light-gathering region 32, no LED chip is disposed. Further, one of the light-emitting side light emitting surfaces of each of the LED chips 31a-31c is directed to face a central portion of the light-gathering region 32.

In the case of the arrangement of LED chips shown in FIG. 5, since there is no LED chip which is disposed to face another LED chip with a light-gathering region 32 being interposed therebetween as opposed to the arrangement of LED chips shown in FIGS. 2A and 2B, the light emitted from the side light emitting surfaces of the LED chip (as indicated by arrows) is not obstructed at all.

It should be noted that when the number of LED chips is an odd number, it is possible to realize the arrangement thereof as shown in FIG. 5. When the number of LED chips is an even number, it is possible to arrange the LED chips as shown in FIGS. 2A and 2B. In either case, it is possible to greatly increase the light-extracting efficiency of the LED chips as compared with the conventional arrangement of LED chips wherein the LED chips are not arranged to surround a light-gathering region.

Figure 6:
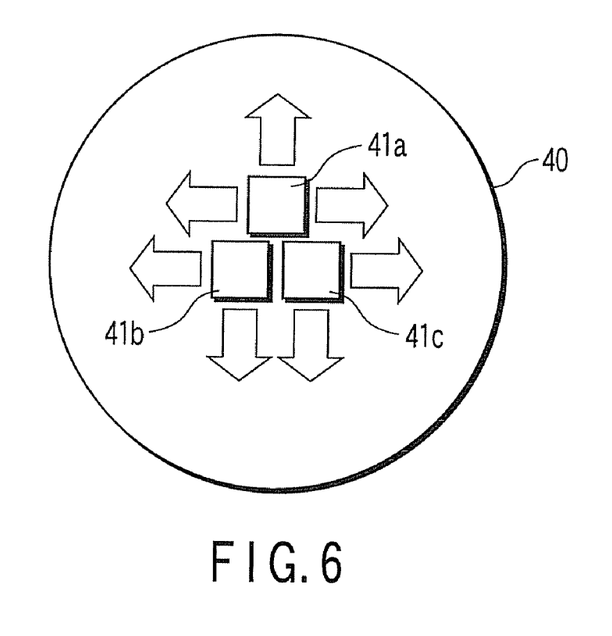
FIG. 6 is a top plan view illustrating an array of LED chips in another conventional LED flash.

As in the arrangement of LED chips shown in FIGS. 3A and 3B, the arrangement of LED chips shown in FIG. 6 is configured such that three LED chips 41a, 41b and 41c are disposed side by side with a narrow space being interposed therebetween, so that no light-gathering region is permitted to exist between these LED chips 41a, 41b and 41c. Although not so prominent as in the case of the arrangement of LED chips shown in FIGS. 3A and 3B, this arrangement of LED chips shown in FIG. 6 is disadvantageous in that, since the light emitted from the facing side light emitting surfaces of neighboring LED chips 41a-41c (as indicated by arrows) is obstructed by one of the neighboring LED chips, the light-extracting efficiency is decreased.

Figure 7:
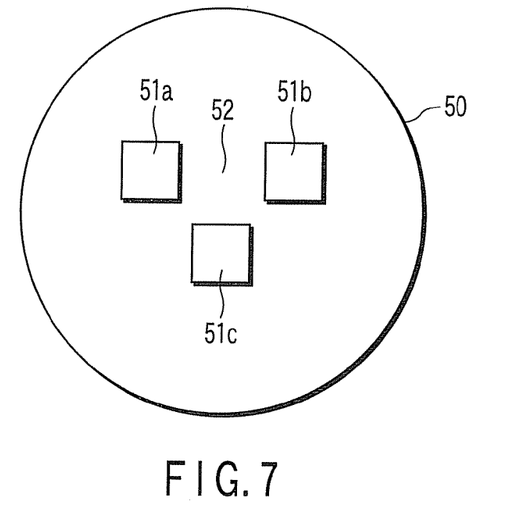
FIG. 7 is a top plan view illustrating an array of LED chips in the LED flash according to a third embodiment of the present invention.

FIG. 7 illustrates the arrangement of LED chips according to a third embodiment of the present invention. In the case of the arrangement of LED chips shown in FIG. 7, a couple of LED chips 51a and 51b each having a rectangular upper light emitting surface are disposed on a substrate 50 with a light-gathering region 52 being interposed therebetween and one more LED chip 51c is disposed close to these LED chips 51a and 51b in such a manner that one vertical side line forming a boundary between neighboring side light emitting surfaces of the LED chip 51c is directed to face one of vertical side lines forming a boundary between neighboring side light emitting surfaces of the LED chip 51a and another vertical side line forming a boundary between neighboring side light emitting surfaces of the LED chip 51c is directed to face one of vertical side lines forming a boundary between neighboring side light emitting surfaces of the LED chip 51b. Namely, while the light-gathering region 12 is surrounded from all directions by the LED chips in the case of the arrangement of LED chips shown in FIGS. 2A and 2B, the arrangement of LED chips shown in FIG. 7 is designed such that a light-gathering region 52 is surrounded from three directions by the LED chips.

Even in the arrangement of LED chips as shown in FIG. 7, the light emitted from the light-emitting side light emitting surfaces of the LED chips 51a-51c is not obstructed by the neighboring LED chips 51a-51c, thereby making it possible to obtain a high light-extracting efficiency.

Figure 8A:
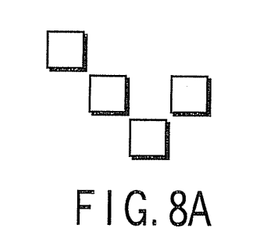
FIG. 8A is a top plan view illustrating a modified example of the array of LED chips shown in FIG. 7.
Figure 8B:
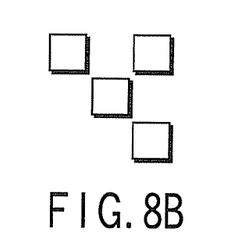
FIG. 8B is a top plan view illustrating another modified example of the array of LED chips shown in FIG. 7.
Figure 8C:
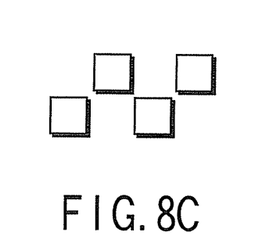
FIG. 8C is a top plan view illustrating a further modified example of the array of LED chips shown in FIG. 7.

FIGS. 8A, 8B and 8C illustrate respectively a modified example of the arrangement of LED chips shown in FIG. 7. Even with any of these arrangements of LED chips shown therein, the light emitted from the light-emitting side light emitting surfaces of the LED chips is not obstructed by the neighboring LED chips, thereby making it possible to obtain high light-extracting efficiency.

Figure 9:
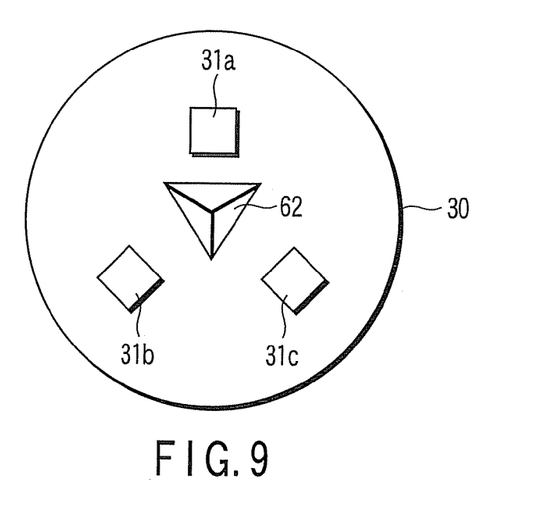
FIG. 9 is a top plan view illustrating an array of LED chips in the LED flash according to a fourth embodiment of the present invention.

FIG. 9 illustrates the arrangement of LED chips according to a fourth embodiment of the present invention, wherein the lighting device is provided with a pyramidal polyhedron 62 which is positioned at the light-gathering region 32 of the arrangement of LED chips 31a-31c shown in FIG. 5. In the construction shown in FIG. 9, the light emitted from the side light emitting surfaces of LED chips 31a-31c is caused to reach the light-gathering region 32 and then reflected by the pyramidal polyhedron 62, thus enabling the light to be emitted upward. As a result, the light can be efficiently extracted out of the LED chips 31a-31c. It should be noted that the term "pyramidal polyhedron" includes a pyramid-like configuration and a truncated pyramid-like configuration, wherein the term "pyramid-like configuration" includes a pyramid and a cone, and the term "truncated pyramid-like configuration" includes a truncated pyramid and a truncated cone.

The pyramidal polyhedron 62 may be formed of metal such as aluminum or formed of a molded body of plastics having a metallic film vapor-deposited on the surface thereof.

In the lighting device explained above, the light emitting element thereof may be constructed to have a fluorescent layer containing a rare earth complex represented by the following general formula (1):

(1)

wherein $R^1$ to $R^6$ are a group selected from the group consisting of linear or branched alkyl group, fluoroalkyl group, alkoxy group, fluoroalkoxy group, aromatic group, and substituted aromatic group; and n is an odd number of 3 or more.

Further, the light emitting element may be constructed to have a fluorescent layer containing a rare earth complex represented by the following general formula (2)

(2)

wherein $R^7$ to $R^{14}$ are a group selected from the group consisting of linear or branched alkyl group, fluoroalkyl group, alkoxy group, fluoroalkoxy group, aromatic group, and substituted aromatic group; and m, n, o and p are an integer.

Next, examples of the present invention and comparative examples will be described to concretely explain the effects of the present invention. It should be noted that in all of these examples and comparative examples, an LED flash having a structure shown in FIG. 1 was manufactured and only the arrangement of LED chips was modified in the measurement of the luminous intensity (cd). In the formation of the fluorescent layer, a mixture comprising a silicone polymer in which 30 wt % of a yttrium aluminum garnet (YAG) fluorescent substance was dispersed was employed as a yellow-emitting fluorescent substance. As for the LED chip, a blue-emitting (wavelength of luminescence center=460 nm, InGaN) LED chip was employed. Further, with regard to the position and characteristics of the reflection plate employed herein, they were the same in every examples.

Example 1

Ten LED flashes each having the same arrangement of LED chips as shown in FIGS. 2A and 2B were manufactured. An electric current of 20 mA was passed through each of the chips mounted in these LED flashes, thereby enabling these LED flashes to emit light. As a result, the luminous intensity was 7.5-9.0 cd.

Comparative Example 1

Ten LED flashes each having the same arrangement of LED chips as shown in FIGS. 3A and 3B were manufactured. An electric current of 20 mA was passed through each of the chips mounted in these LED flashes, thereby enabling these LED flashes to emit light. As a result, the luminous intensity was 6.2-7.1 cd. It was found, through the comparison between the results obtained herein and the results obtained from Example 1, that even if the number of LED chips was the same with other, it was found possible to enhance the luminous intensity by about 27% owing to the arrangement of Example 1.

Example 2

Ten LED flashes each having the same arrangement of LED chips as shown in FIG. 5 were manufactured. An electric current of 20 mA was passed through each of the chips mounted in these LED flashes, thereby enabling these LED flashes to emit light. As a result, the luminous intensity was 6.0-7.5 cd. It was found, from the results obtained herein, that although the number of LED chips was only three, it was found possible to obtain almost the same intensity of light as that of the LED flashes of Comparative Example 1 each provided with four LED chips.

Comparative Example 2

Ten LED flashes each having the same arrangement of LED chips as shown in FIG. 6 were manufactured. An electric current of 20 mA was passed through each of the chips mounted in these LED flashes, thereby enabling these LED flashes to emit light. As a result, the luminous intensity was 4.5-5.5 cd.

Example 3

Ten LED flashes each having an arrangement of three LED chips and a triangular pyramidal polymer block having a silver layer deposited on the surface thereof and disposed in the light-gathering region as shown in FIG. 9 were manufactured. An electric current of 20 mA was passed through each of the chips mounted in these LED flashes, thereby enabling these LED flashes to emit light. As a result, the luminous intensity was 6.5-8.0 cd.

It was found, from the results obtained herein, that even though the arrangement of LED chips was the same as the arrangement of LED chips of Example 2, it was found possible to increase the luminous intensity as compared with that of the LED flashes of Example 2. The reason for this was assumed to be ascribed to the fact that since the reflecting body was disposed in the light-gathering region, the light was caused to converge in front of the LED chips in addition to the enhancement of the light-extracting efficiency owing to the specific arrangement of LED chips.

Example 4

Ten LED flashes each having the same arrangement of LED chips as that of Example 1 were manufactured, wherein the LED chip was formed of one exhibiting 395 nm in luminescence center wavelength and the fluorescent layer was formed of a mixture comprising a polymer represented by the following formula (3), and 30 wt % of an europium complex represented by the following formula (4) and dissolved in the polymer. An electric current of 20 mA was passed through each of these LED flashes, thereby enabling these LED flashes to emit red light. As a result, the luminous intensity was 1.1 cd, the magnitude of which was considered exceptionally large for a red LED.

(3)

wherein $R^{15}$, $R^{16}$ and $R^{17}$ are alkyl group, and X is halogen.

(4)

Example 5

Red LED flashes which were the same in kind as those of Example 4 were prepared in the same manner as described in Example 4 except that a compound represented by the following formula (5) was employed as an europium complex. As a result, the luminous intensity was 1.0 cd, the magnitude of which was considered exceptionally large for a red LED.

(5)

It will be recognized from the comparison between Example 4 and Example 5 that the red LED flashes of Example 5 was higher in intensity of light than those of Example 5. The reason for this was assumed to be ascribed to the fact that since the solubility of the fluorescent substance used in Example 4 was higher than that of the fluorescent substance used in Example 5, the transparency of the fluorescent layer formed thereof was more excellent, thus making it possible to further enhance the efficiency of extracting the light therefrom. When the number (n) of methylene chains at the node portion of phosphine oxide moiety was an odd number, the solubility and amorphousness were more excellent as compared with the case where the number (n) of methylene chains was an even number.

Example 6

Red LED flashes which were the same in kind as those of Example 4 were prepared in the same manner as described in Example 4 except that a compound represented by the following formula was employed as an europium complex. As a result, the luminous intensity was 1.1 cd, the magnitude of which was considered exceptionally large for a red LED.

It should not be construed that the present invention is limited to the aforementioned embodiments and examples. For example, although an LED chip was employed as a light emitting element in the examples, the present invention is not limited to the LED chip. Namely, it is possible to employ a laser diode as a light emitting element.

Further, the present invention is not limited to the above-described embodiments per se but constituent elements of these embodiments may be variously modified in actual use thereof without departing from the spirit of the present invention. Further, the constituent elements described in these various embodiments may be suitably combined to create various inventions. For example, some of the constituent elements described in these embodiments may be deleted. Further, the constituent elements described in different embodiments may be optionally combined with each other.

As described above, according to the lighting device representing one aspect of the present invention, since a plurality of light emitting elements are disposed in such a manner that the emission from the side light emitting surfaces thereof is not to be obstructed by neighboring or facing light emitting elements, it is possible to greatly enhance the light-extracting efficiency. As a result, it is possible to provide a flash which is capable of exhibiting a sufficient luminance and color rendering with the employment of low electric power and to provide an image pickup apparatus or a portable terminal unit each having such a flash mounted thereon.

The invention claimed is:

1. A lighting device comprising:
   a substrate; and
   at least three light emitting elements mounted on the substrate, each having an upper light emitting surface in rectangular shape and side light emitting surfaces in rectangular shape and each emitting near-ultraviolet or blue light; and
   a fluorescent layer covering the light emitting elements, wherein the light emitting elements are positioned to surround a light-gathering region where the light emitting elements are not located, and one side of the light emitting surfaces of each light emitting element is directed to face approximately a central portion of the light-gathering region, and the light emitting elements are arranged such that there is no light emitting element which is disposed to face another light emitting element with the light gathering region being interposed therebetween.

2. The lighting device according to claim 1, wherein a reflector is arranged in the light-gathering region, the reflector having a shape selected from the group consisting of a cone, pyramid, truncated cone and truncated pyramid, and having a slant surface which is directed to face one of the side light emitting surfaces of each of the light emitting elements.

3. The lighting device according to claim 1, wherein a reflection plate is disposed around and/or beneath the region where the light emitting elements are disposed.

4. A flash comprising the lighting device claimed in claim 1.

5. An image pickup apparatus comprising the flash claimed in claim 4 equipped therewith.

6. A portable terminal unit comprising the image pickup apparatus claimed in claim 5 equipped therewith.

7. A lighting device according to claim 1,
   wherein the light emitting elements comprise a fluorescent layer containing a rare earth complex wherein β-diketone and a phosphine oxide compound are coordinated to a rare earth atom.

8. A lighting device according to claim 7, wherein the rare earth atom is europium.

9. A lighting device according to claim 7, wherein the rare earth complex is represented by the following general formula (1):

wherein $R^1$ to $R^6$ are a group selected from the group consisting of linear or branched alkyl group, fluoroalkyl group, alkoxy group, fluoroalkoxy group, aromatic group, and substituted aromatic group; and n is an odd number of 3 or more.

10. A lighting device according to claim 7, wherein the rare earth complex is represented by the following general formula (2):

wherein $R^7$ to $R^{14}$ are a group selected from the group consisting of linear or branched alkyl group, fluoroalkyl group, alkoxy group, fluoroalkoxy group, aromatic group, and substituted aromatic group; and m, n, o and p are an integer.

11. The lighting device according to claim 1, wherein each light emitting element has a same wavelength of luminescence.

12. The lighting device according to claim 1, wherein at least three light emitting elements are arranged to surround the light-gathering region such that a light emitted from the side light emitting surface of the light emitting elements is not obstructed.

13. The lighting device according to claim 1, wherein a number of light emitting elements is four.

14. The lighting device according to claim 1, wherein the substrate has a recessed portion, and the light emitting elements are disposed on a bottom of the recessed portion.

15. A lighting device comprising:
a substrate; and
at least three light emitting elements mounted on the substrate, each having an upper light emitting surface in rectangular shape and side light emitting surfaces in rectangular shape, and each emitting near-ultraviolet or blue light, the light emitting elements comprising a first, second, and third light emitting elements; and
a fluorescent layer covering the light emitting elements,
wherein one side light of the emitting surfaces of the first light emitting element is directed to face one of the side light emitting surfaces of the second light emitting element, with a light-gathering region, where the light emitting elements are not located, being interposed therebetween; the third light emitting element is disposed close to the first and second light emitting elements; a first vertical side line forming a boundary between neighboring side light emitting surfaces of the first light emitting element is directed to face one of third vertical side lines forming boundaries between neighboring side light emitting surfaces of the third light emitting element; and a second vertical side line forming a boundary between neighboring side light emitting surfaces of the second light emitting element is directed to face another one of third vertical side lines forming boundaries between neighboring side light emitting surfaces of the third light emitting element.

16. The lighting device according to claim 15, wherein the first vertical side line and the one of third vertical side lines exist on a vertical plane including approximately central axes of the first and third light emitting elements; and the second vertical side line and the other one of third vertical side lines exist on a vertical plane including approximately central axes of the second and third light emitting elements.

17. A lighting device comprising:
a substrate;
at least three light emitting elements mounted on the substrate, each having an upper light emitting surface in rectangular shape and side light emitting surfaces in rectangular shape, and each emitting near-ultraviolet or blue light; and
a fluorescent layer covering the light emitting elements,
wherein the light emitting elements are positioned to surround a light-gathering region where the light emitting elements are not located, one side of the light emitting surfaces of each light emitting element is directed to face approximately a central portion of the light-gathering region, and any one side of the light emitting surfaces of one light emitting element is not directed to face any one side of the light emitting surfaces of another light emitting element, with the light gathering region, where the light emitting elements are not located, being interposed therebetween.

18. The lighting device according to claim 17, wherein a reflector is arranged in the light-gathering region, the reflector having a shape selected from the group consisting of a cone, pyramid, truncated cone and truncated pyramid, and having a slant surface which is directed to face one of the side light emitting surfaces of each of the light emitting elements.

19. The lighting device according to claim 17, wherein a reflection plate is disposed around and/or beneath the region where the light emitting elements are disposed.

20. A flash comprising the lighting device claimed in claim 17.

21. A lighting device comprising:
a substrate;
at least three light emitting elements mounted on the substrate, each having an upper light emitting surface in rectangular shape and side light emitting surfaces in rectangular shape, and each emitting near-ultraviolet or blue light; and
a fluorescent layer covering the light emitting elements, wherein the light emitting elements are positioned to surround a light-gathering region where the light emitting elements are not located, one side of the light emitting surfaces of each light emitting element is directed to face approximately a central portion of the light gathering region, and the light emitting elements are arranged such that there is a light emitting element which is disposed to face another light emitting element with the light gathering region being interposed therebetween.

22. The lighting device according to claim 21, wherein a reflector is arranged in the light-gathering region, the reflector having a shape selected from the group consisting of a cone, pyramid, truncated cone, and truncated pyramid, and having a slant surface which is directed to face one of the side light emitting surfaces of each of the light emitting elements.

23. The lighting device according to claim 21, wherein a reflection plate is disposed around and/or beneath the region where the light emitting elements are disposed.

24. A flash comprising the lighting device claimed in claim 21.

* * * * *